US010768220B2

(12) United States Patent
Ding et al.

(10) Patent No.: US 10,768,220 B2
(45) Date of Patent: Sep. 8, 2020

(54) REFRIGERATION SYSTEM, FAILURE DIAGNOSTIC SYSTEM THEREOF, FAILURE DIAGNOSTIC METHOD, CONTROLLER AND STORAGE MEDIUM

(71) Applicant: Carrier Corporation, Palm Beach Gardens, FL (US)

(72) Inventors: Shufu Ding, Shanghai (CN); QiaoHui Shi, Shanghai (CN); Shuang Li, Shanghai (CN); Zhongjian Li, Shanghai (CN); Hui Li, Shanghai (CN)

(73) Assignee: CARRIER CORPORATION, Palm Beach Gardens, FL (US)

( * ) Notice: Subject to any disclaimer, the term of this patent is extended or adjusted under 35 U.S.C. 154(b) by 91 days.

(21) Appl. No.: 16/210,310

(22) Filed: Dec. 5, 2018

(65) Prior Publication Data

US 2019/0178932 A1 Jun. 13, 2019

(30) Foreign Application Priority Data

Dec. 7, 2017 (CN) .......................... 2017 1 1285927

(51) Int. Cl.
*G01R 31/28* (2006.01)
*F25B 49/00* (2006.01)
*G08B 21/18* (2006.01)
(52) U.S. Cl.
CPC .......... *G01R 31/2825* (2013.01); *F25B 49/00* (2013.01); *F25B 49/005* (2013.01); *G08B 21/187* (2013.01); *F25B 2500/06* (2013.01); *F25B 2500/12* (2013.01); *F25B 2700/03* (2013.01); *F25B 2700/197* (2013.01); *F25B 2700/1932* (2013.01); *F25B 2700/21172* (2013.01)

(58) Field of Classification Search
CPC G01R 31/2853; G01R 31/26; G01R 31/2884; G11C 29/025
USPC .................................... 324/500, 537, 762.01
See application file for complete search history.

(56) References Cited

U.S. PATENT DOCUMENTS 5,953,226 A 9/1999 Mellish et al.
6,643,592 B1 11/2003 Loman et al.
6,678,584 B2 1/2004 Junk et al.
(Continued)

FOREIGN PATENT DOCUMENTS

EP 2420751 A1 2/2012
EP 2650619 A1 10/2013
SG 10201405517 4/2015

OTHER PUBLICATIONS

European Search Report for application 18210665.8, dated Apr. 15, 2019, 8 pages.

*Primary Examiner* — Giovanni Astacio-Oquendo
(74) *Attorney, Agent, or Firm* — Cantor Colburn LLP

(57) ABSTRACT

A refrigeration system, a fault diagnosis system and a fault diagnosis method for the refrigeration system, a controller and a storage medium. The fault diagnosis method includes: receiving a fault alarm sent by an associated refrigeration system, and acquiring a fault cause list associated with the fault alarm; determining whether to run a fault diagnosis system associated with the fault alarm; and when the fault diagnosis system associated with the fault alarm is run, checking the associated refrigeration system sequentially according to the fault cause list, and acquiring a fault cause and a repair means list associated with the fault cause.

20 Claims, 6 Drawing Sheets

(56) References Cited

U.S. PATENT DOCUMENTS

| | | |
|---|---|---|
| 7,085,610 B2 | 8/2006 | Eryurek et al. |
| 7,349,746 B2 | 3/2008 | Emigholz et al. |
| 7,570,174 B2 | 8/2009 | Byrne et al. |
| 8,655,830 B2 | 2/2014 | Mackay |
| 8,731,724 B2 | 5/2014 | Drees et al. |
| 8,762,301 B1 | 6/2014 | Buckbee, Jr. |
| 8,839,036 B2 | 9/2014 | Rymeski et al. |
| 8,890,676 B1 | 11/2014 | Heath |
| 8,935,571 B2 | 1/2015 | Lee |
| 9,070,174 B2 | 6/2015 | Beaulieu et al. |
| 9,760,100 B2 | 9/2017 | Garr et al. |
| 2013/0197698 A1 | 8/2013 | Shah et al. |
| 2015/0145524 A1* | 5/2015 | Duncan .................. G01R 31/50 324/538 |
| 2015/0379785 A1 | 12/2015 | Brown, Jr. et al. |
| 2016/0054370 A1* | 2/2016 | Fomin .................. G01R 31/312 324/509 |
| 2016/0178689 A1* | 6/2016 | Okita .................... G01R 31/50 324/509 |

* cited by examiner

REFRIGERATION SYSTEM, FAILURE DIAGNOSTIC SYSTEM THEREOF, FAILURE DIAGNOSTIC METHOD, CONTROLLER AND STORAGE MEDIUM

FOREIGN PRIORITY

This application claims priority to Chinese Patent Application No. 201711285927.4, filed Dec. 7, 2017, and all the benefits accruing therefrom under 35 U.S.C. § 119, the contents of which in its entirety are herein incorporated by reference.

TECHNICAL FIELD

The present invention relates to the field of refrigeration, and more specifically to a fault diagnosis system and method for a refrigeration system.

BACKGROUND ART

Due to the complexity of large-scale commercial refrigeration devices, these devices usually require regular maintenance and repair by professional personnel or require on-site repair by professional personnel when an error is reported due to a fault. However, maintenance personnel having different working experience, whether they are engineers hired by companies using the devices or engineers dispatched by device suppliers, may have different maintenance results. It may be difficult for some novice engineers to find fault causes of field devices and corresponding repair means. Even if the novice engineers communicate with senior engineers over the phone or network, it is still possible that the device fault cannot be resolved or a long time needs to be taken to resolve the problem due to unclear description or misunderstanding. This will greatly increase the shutdown time of the refrigeration device, thus causing poor use experience and after-sales service experience for device users.

SUMMARY OF THE INVENTION

An objective of the present invention is to provide a fault diagnosis method assisting in refrigeration system fault diagnosis.

Another objective of the present invention is to provide a fault diagnosis system assisting in refrigeration system fault diagnosis.

Still another objective of the present invention is to provide a controller for executing the foregoing fault diagnosis method.

Further another objective of the present invention is to provide a storage medium storing a program executing the foregoing fault diagnosis method.

Yet another objective of the present invention is to provide a refrigeration system that uses the foregoing fault diagnosis system.

To achieve the objectives of the present invention, according to an aspect of the present invention, a fault diagnosis method for a refrigeration system is provided, including: Step S100, receiving a fault alarm sent by an associated refrigeration system, and acquiring a fault cause list associated with the fault alarm; Step S200, determining whether to run a fault diagnosis system associated with the fault alarm; and Step S300, when the fault diagnosis system associated with the fault alarm is run, checking the associated refrigeration system sequentially according to the fault cause list, and acquiring a fault cause and a repair means list associated with the fault cause.

Optionally, the fault diagnosis method further includes Step S400: when the fault diagnosis system associated with the fault alarm is not run, directly outputting the fault cause list associated with the fault alarm.

Optionally, the fault diagnosis method further includes Step S500: inputting fault diagnosis feedback, wherein the fault diagnosis feedback includes: the fault has been resolved or the fault is not resolved.

Optionally, the fault diagnosis feedback that the fault has been resolved includes: the fault has been resolved based on the repair means list associated with the fault cause, or the fault has been resolved based on a new repair means for the fault cause, or the fault has been resolved based on a new fault cause and a new repair means for the new fault cause.

Optionally, the fault diagnosis method further includes Step S600: when the fault has been resolved based on a new repair means for the fault cause, entering the new repair means into the repair means list and associating the new repair means with the fault cause; or when the fault has been resolved based on a new fault cause and a new repair means for the new fault cause, entering the new fault cause into the fault cause list, creating a repair means list associated with the new fault cause, and entering the new repair means into the repair means list.

Optionally, the fault diagnosis feedback that the fault is not resolved includes: no fault cause is found, or no repair means is found.

Optionally, when the fault cause list includes multiple fault causes, the multiple fault causes are sorted according to priorities based on operation convenience and/or fault possibilities, wherein a fault cause with high operation convenience and/or a high fault possibility has a high priority; and the associated refrigeration system is checked according to the priority order in Step S300.

Optionally, when the repair means list includes multiple repair means, the multiple repair means are sorted according to recommendation levels based on repair convenience and/or repair possibilities, and a repair means cause with high repair convenience and/or a high repair possibility has a high recommendation level.

Optionally, each of the fault causes is associated with one or more of the repair means.

Optionally, each fault cause includes one or more judgment conditions.

To achieve the objectives of the present invention, according to another aspect of the present invention, a fault diagnosis system for a refrigeration system is provided, including: a receiving module configured to receive a fault alarm sent by an associated refrigeration system; a storage module configured to store fault cause lists, associations of the fault cause lists and fault alarms, repair means lists and associations of the repair means lists and fault causes; and a processing module configured to acquire a fault cause list associated with the fault alarm; determine whether to run the fault diagnosis system associated with the fault alarm; and when the fault diagnosis system associated with the fault alarm is run, check the associated refrigeration system sequentially according to the fault cause list and acquire a fault cause and a repair means list associated with the fault cause; or when the fault diagnosis system associated with the fault alarm is not run, directly output the fault cause list associated with the fault alarm.

Optionally, the fault diagnosis system further includes a feedback module configured to receive fault diagnosis feedback, wherein the fault diagnosis feedback includes: the fault has been resolved or the fault is not resolved.

Optionally, the fault diagnosis feedback that the fault has been resolved includes: the fault has been resolved based on the repair means list associated with the fault cause, or the fault has been resolved based on a new repair means for the fault cause, or the fault has been resolved based on a new fault cause and a new repair means for the new fault cause.

Optionally, the fault diagnosis system further includes a learning module configured to: when the fault has been resolved based on a new repair means for the fault cause, enter the new repair means into the repair means list and associate the new repair means with the fault cause; or when the fault has been resolved based on a new fault cause and a new repair means for the new fault cause, enter the new fault cause into the fault cause list, create a repair means list associated with the new fault cause, and enter the new repair means into the repair means list.

Optionally, the fault diagnosis feedback that the fault is not resolved includes: no fault cause is found, or no repair means is found.

Optionally, the fault diagnosis system further includes a sorting module configured to: when the fault cause list includes multiple fault causes, sort the multiple fault causes according to priorities based on operation convenience and/or fault possibilities, wherein a fault cause with high operation convenience and/or a high fault possibility has a high priority; and/or when the repair means list includes multiple repair means, sort the multiple repair means according to recommendation levels based on repair convenience and/or repair possibilities, wherein a repair means cause with high repair convenience and/or a high repair possibility has a high recommendation level.

Optionally, the fault diagnosis system further includes an interaction module configured to provide information interaction between on-site maintenance personnel and a control center administrator.

To achieve the objectives of the present invention, according to still another aspect of the present invention, a controller is provided, including a processor and a memory, wherein the memory is configured to store instructions, and the method described above is implemented when the processor executes the instructions.

To achieve the objectives of the present invention, according to still another aspect of the present invention, a storage medium configured to store a program is provided, wherein the program can implement the method described above when being executed.

To achieve the objectives of the present invention, according to still another aspect of the present invention, a refrigeration system is provided, including a communication module configured to send a fault alarm to the fault diagnosis system described above.

According to the refrigeration system, the fault diagnosis system and fault diagnosis method for the refrigeration system, the controller and the storage medium in the present invention, fault diagnosis experience and repair means accumulated by senior engineers are integrated in the fault diagnosis system, so as to provide a standardized fault diagnosis process after the refrigeration device reports an error, thus greatly improving the efficiency of fault diagnosis and repair and also lowering the requirement on professional qualities of maintenance personnel. As such, the fault repair becomes more convenient and after-sales experience of device users is improved.

DETAILED DESCRIPTION

Figure 1:
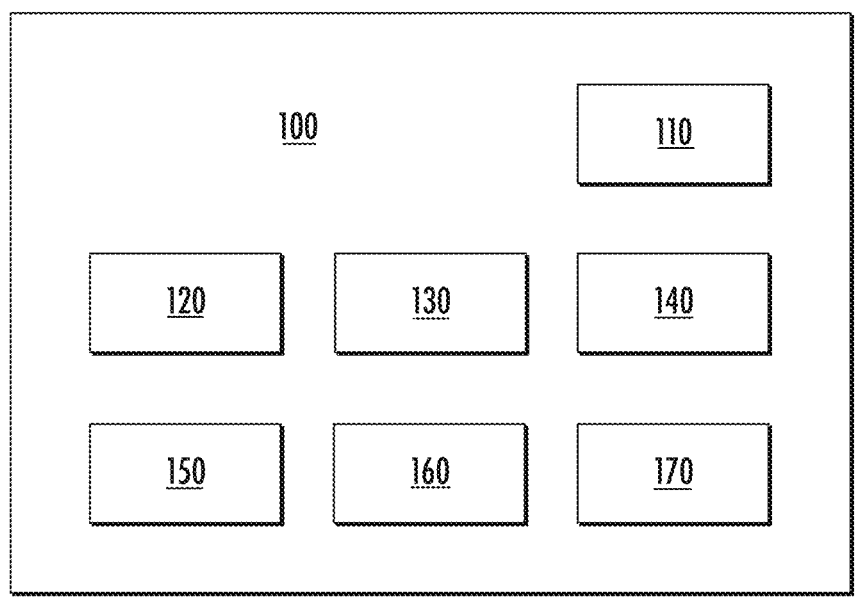
FIG. 1 is a schematic diagram of an embodiment of a fault diagnosis system according to the present invention.

Referring to FIG. 1, according to an embodiment of the present invention, a fault diagnosis system 100 for a refrigeration system is provided, including a receiving module 110, a storage module 120 and a processing module 130. These functional modules cooperate with each other to implement basic functions of fault diagnosis.

The receiving module 110 is configured to receive a fault alarm sent by an associated refrigeration system. The storage module 120 is configured to store fault cause lists, associations of the fault cause lists and fault alarms, repair means lists and associations of the repair means lists and fault causes. Most importantly, the processing module 130 is configured to acquire a fault cause list associated with the fault alarm; determine whether to run the fault diagnosis system 100 associated with the fault alarm; and when the fault diagnosis system 100 associated with the fault alarm is run, check the associated refrigeration system sequentially according to the fault cause list and acquire a fault cause and a repair means list associated with the fault cause; or when the fault diagnosis system 100 associated with the fault alarm is not run, directly output the fault cause list associated with the fault alarm. In the fault diagnosis system 100 according to this conception, fault diagnosis experience and repair means accumulated by senior engineers are integrated in the fault diagnosis system 100, so as to provide a standardized fault diagnosis process after the refrigeration device reports an error, thus greatly improving the efficiency of fault diagnosis and repair and also lowering the requirement on professional qualities of maintenance personnel. As such, the fault repair becomes more convenient and after-sales experience of device users is improved.

In addition, in order to further improve the system and optimize its additional functions while implementing the basic functions of fault diagnosis, the system can further be improved from many aspects, which will be illustrated below.

For example, the fault diagnosis system 100 further includes a feedback module 140 configured to receive fault diagnosis feedback. The received fault diagnosis feedback includes: a feedback result indicating that the fault has been resolved or a feedback result indicating that the fault is not resolved.

More specifically, on one hand, the fault diagnosis feedback that the fault has been resolved includes: the fault has been resolved based on the repair means list associated with the fault cause, which means that preset data of the fault diagnosis system 100 is enough to accomplish the fault diagnosis and repair. Or, the fault has been resolved based on a new repair means for the fault cause, which means that the preset data of the fault diagnosis system 100 is enough to accomplish the fault diagnosis while built-in repair means of the system are not enough to repair the fault, and fault repair is accomplished based on a new repair means. Specifically, the new repair means can be obtained through communication with a senior engineer or through various debugging methods on site. Or, the fault has been resolved based on a new fault cause and a new repair means for the new fault cause, which means that the preset data of the fault diagnosis system 100 is not enough to accomplish the fault diagnosis and subsequent repair; a new fault cause is diagnosed and fault repair is accomplished through a new repair means for the new fault cause. Specifically, the new fault cause and/or the new repair means can be found through communication with a senior engineer or through various debugging methods on site.

On the other hand, the fault diagnosis feedback that the fault is not resolved includes: no fault cause is found, or no repair means is found. This means that the preset data of the fault diagnosis system 100 is not enough to accomplish the fault diagnosis and subsequent repair, and the problem still cannot be found and repaired through additional on-site debugging and/or remote communication with the senior engineer. In this case, it is necessary to further follow up the fault phenomenon and make remedial measures.

For another example, the fault diagnosis system 100 further includes a learning module 150. When maintenance personnel accomplish the fault diagnosis and repair based on a fault cause and/or a repair means other than the preset data of the fault diagnosis system 100, the latest fault cause and/or fault means can be entered into the system to improve the preset data of the system, thus continuously optimizing the function of the fault diagnosis system 100. Specifically, the learning module 150 is configured to: when the fault has been resolved based on a new repair means for the fault cause, enter the new repair means into the repair means list and associate the new repair means with the fault cause; or when the fault has been resolved based on a new fault cause and a new repair means for the new fault cause, enter the new fault cause into the fault cause list, create a repair means list associated with the new fault cause, and enter the new repair means into the repair means list.

For another example, in an actual application, one fault alarm of the refrigeration device may correspond to multiple fault causes that probably cannot be diagnosed at the same time. Therefore, a sequence of diagnosing these fault causes needs to be considered. In addition, one fault cause may also correspond to multiple repair means that probably cannot be performed at the same time. Therefore, a sequence of picking out these repair means needs to be considered. In conclusion, based on the considerations above, the fault diagnosis system 100 further includes a sorting module 160 configured to: when the fault cause list includes multiple fault causes, sort the multiple fault causes according to priorities based on operation convenience and/or fault possibilities, wherein a fault cause with high operation convenience and/or a high fault possibility has a high priority; and/or when the repair means list includes multiple repair means, sort the multiple repair means according to recommendation levels based on repair convenience and/or repair possibilities, wherein a repair means cause with high repair convenience and/or a high repair possibility has a high recommendation level.

In addition, as a supplement to the functional completeness, the fault diagnosis system 100 further includes an interaction module 170 configured to provide information interaction between on-site maintenance personnel and a control center administrator, so that the control center administrator can know the progress of the on-site maintenance and provide necessary support.

Figure 2:
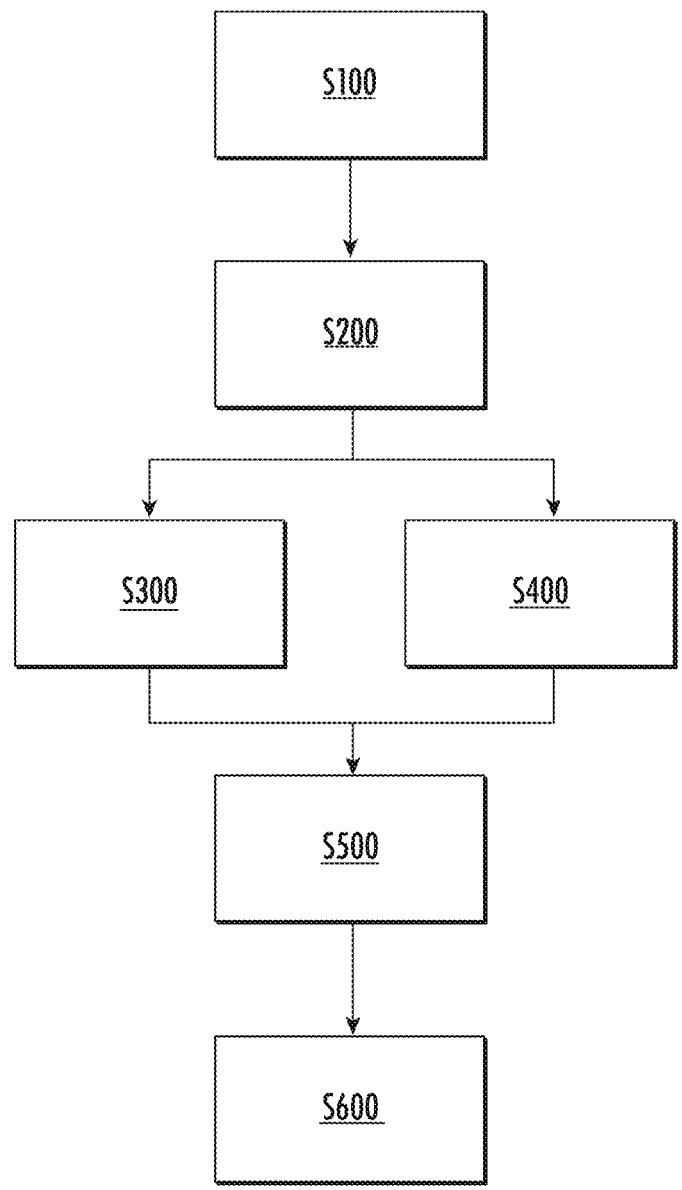
FIG. 2 is a schematic diagram of an embodiment of a fault diagnosis method according to the present invention.

Referring to FIG. 2, according to another embodiment of the present invention, a fault diagnosis method for a refrigeration system is further provided, including: Step S100, receiving a fault alarm sent by an associated refrigeration system, and acquiring a fault cause list associated with the fault alarm; Step S200, determining whether to run a fault diagnosis system associated with the fault alarm; and Step S300, when the fault diagnosis system associated with the fault alarm is run, checking the associated refrigeration system sequentially according to the fault cause list, and acquiring a fault cause and a repair means list associated with the fault cause.

In the fault diagnosis method according to this conception, by using fault diagnosis experience and repair means accumulated by senior engineers and preset in the fault diagnosis system, a standardized fault diagnosis process is provided with reference to the steps provided in the fault diagnosis method after the refrigeration device generates an alarm, thus greatly improving the efficiency of fault diagnosis and repair and also lowering the requirement on professional qualities of maintenance personnel. As such, the fault repair becomes more convenient and after-sales experience of device users is improved.

In addition, in order to further improve the fault diagnosis method and optimize its additional functions while implementing the basic functions of fault diagnosis, the method can further be improved from many aspects, which will be illustrated below.

For example, the fault diagnosis method further includes Step S400: when the fault diagnosis system associated with the fault alarm is not run, directly output the fault cause list associated with the fault alarm. In some special cases, if the maintenance personnel do not want to run the fault diagnosis system, the fault cause list can also be output directly, so that the maintenance personnel can carry out diagnosis or perform subsequent operations conveniently.

For example, the fault diagnosis method further includes Step S500 for providing fault diagnosis feedback. In Step S500, fault diagnosis feedback is input. The fault diagnosis feedback includes: the fault has been resolved or the fault is not resolved.

More specifically, on one hand, the fault diagnosis feedback that the fault has been resolved includes: the fault has been resolved based on the repair means list associated with the fault cause, which means that the preset data of the fault diagnosis system and the fault diagnosis method are enough to accomplish the fault diagnosis and repair. Or, the fault has been resolved based on a new repair means for the fault cause, which means that the preset data of the fault diagnosis system and the fault diagnosis method are enough to accomplish the fault diagnosis while built-in repair means of the system are not enough to repair the fault, and fault repair is accomplished based on a new repair means. Specifically, the new repair means can be obtained through communication with a senior engineer or through various debugging methods on site. Or, the fault has been resolved based on a new fault cause and a new repair means for the new fault cause, which means that the preset data of the fault diagnosis system and the fault diagnosis method are not enough to accomplish the fault diagnosis and subsequent repair; a new fault cause is diagnosed and fault repair is accomplished through a new repair means for the new fault cause. Specifically, the new fault cause and/or the new repair means can be found through communication with a senior engineer or through various debugging methods on site.

On the other hand, the fault diagnosis feedback that the fault is not resolved includes: no fault cause is found, or no repair means is found. This means that the preset data of the fault diagnosis system and the fault diagnosis method are not enough to accomplish the fault diagnosis and subsequent repair, and the problem still cannot be found and repaired through additional on-site debugging and/or remote communication with the senior engineer. In this case, it is necessary to further follow up the fault phenomenon and make remedial measures.

For another example, the fault diagnosis method further includes a learning step: when maintenance personnel accomplish the fault diagnosis and repair based on a fault cause and/or a repair means other than the preset data of the fault diagnosis system, the latest fault cause and/or fault means can be entered into the system to improve the preset data of the system, thus continuously optimizing the function of the fault diagnosis system. Specifically, Step S600 includes: when the fault has been resolved based on a new repair means for the fault cause, entering the new repair means into the repair means list and associating the new repair means with the fault cause; or when the fault has been resolved based on a new fault cause and a new repair means for the new fault cause, entering the new fault cause into the fault cause list, creating a repair means list associated with the new fault cause, and entering the new repair means into the repair means list.

For another example, in an actual application, one fault alarm of the refrigeration device may correspond to multiple fault causes that probably cannot be diagnosed at the same time. Therefore, a sequence of diagnosing these fault causes needs to be considered. In this case, when the fault cause list includes multiple fault causes, the multiple fault causes are sorted according to priorities based on operation convenience and/or fault possibilities, wherein a fault cause with high operation convenience and/or a high fault possibility has a high priority. In Step S300, the associated refrigeration system is checked according to the priority order.

In addition, one fault cause may also correspond to one or more repair means that probably cannot be performed at the same time. Therefore, a sequence of picking out these repair means needs to be considered. In this case, when the repair means list includes multiple repair means, the multiple repair means are sorted according to recommendation levels based on repair convenience and/or repair possibilities, wherein a repair means cause with high repair convenience and/or a high repair possibility has a high recommendation level.

In addition, it should be noted that in the fault diagnosis method in the foregoing embodiment, each fault cause may include one or more judgment conditions. In this case, judgment should be made based on each judgment condition to determine whether the device alarm corresponds to the fault cause.

Several specific embodiments using the foregoing fault diagnosis system and fault diagnosis method will be described below with reference to the accompanying drawings.

Figure 3:
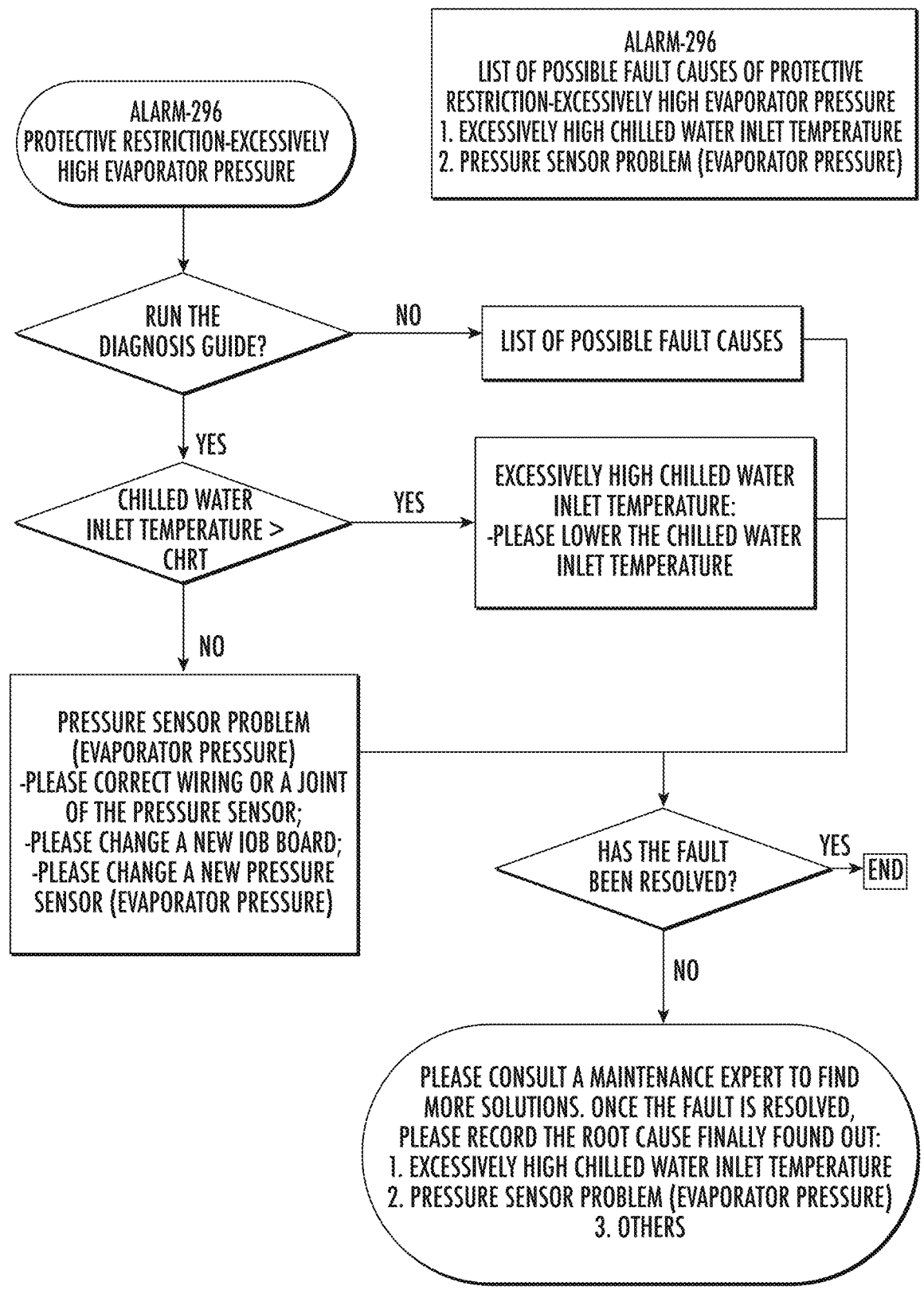
FIG. 3 is a flowchart of an embodiment of fault diagnosis by using the fault diagnosis method according to the present invention.

Referring to FIG. 3, when the refrigeration system associated with the fault diagnosis system is shut down due to a fault and sends a No. 296 fault alarm indicating "excessively high evaporator pressure," the maintenance personnel can receive a corresponding alarm signal through the fault diagnosis system and determine whether to run the fault diagnosis system.

If the maintenance personnel determine that it is unnecessary to run the fault diagnosis system, the fault diagnosis system will directly output a fault cause list associated with the No. 296 fault alarm. Then, the maintenance personnel can carry out troubleshooting according to each fault cause in the fault cause list or autonomously, and repair the fault by using the repair means list corresponding to each fault cause or based on their own experience. After the foregoing process is completed, feedback indicating whether the fault is resolved is input to the fault diagnosis system. If the fault is not resolved yet, follow-up is further needed. If the fault has been resolved, the used fault cause and repair means are recorded, so as to help adjust priorities and/or recommendation levels of the fault causes and repair means accordingly. If the found fault cause and repair means are not recorded in the fault diagnosis system previously, the new fault cause and/or repair means are/is entered and associated, so as to further improve the fault system.

If the maintenance personnel determine to run the fault diagnosis system, the fault diagnosis system will check fault causes one by one based on their priorities according to the fault cause list associated with the No. 296 fault alarm. The operation convenience and/or fault possibilities are also taken into consideration in the troubleshooting priorities here, and the chilled water inlet temperature and pressure sensor are checked in sequence.

In addition, it is first determined whether the chilled water inlet temperature of the refrigeration system is greater than a set threshold. If yes, the cause of the fault may be an excessively high chilled water inlet temperature. After that, a corresponding repair means list can be invoked, and the problem can be fixed by lowering the chilled water inlet temperature. After the foregoing process is completed, feedback indicating whether the fault has been resolved is input to the fault diagnosis system. If the fault is not resolved yet, follow-up is further needed. If the fault has been resolved, the used fault cause and the repair means are recorded, so as to help adjust priorities and/or recommendation levels of the fault causes and repair means accordingly. If the found fault cause and repair means are not recorded in the fault diagnosis system previously, the new fault cause and/or repair means are/is entered and associated, so as to further improve the fault system.

If it is found after the check that the chilled water inlet temperature of the refrigeration system is not greater than the set threshold, the cause of the fault may be that the pressure sensor (this parameter can reflect an evaporator pressure) is abnormal. After that, a corresponding repair means list can be invoked, and one of or a combination of the repair means can be selected according to the recommendation levels, so as to repair the foregoing fault quickly and reliably. Repair convenience and/or repair possibilities are also taken into consideration in the recommendation levels of the repair means here, and the repair means are as follows in order: fixing the problem by correcting wiring or a joint of the pressure sensor, by changing a new input/output circuit board (IOB), or by changing a new pressure sensor (for detecting the evaporator pressure).

After the foregoing process is completed, feedback indicating whether the fault has been resolved is input to the fault diagnosis system. If the fault is not resolved yet, follow-up is further needed. If the fault has been resolved, the used fault cause and the repair means are recorded, so as to help adjust priorities and/or recommendation levels of the fault causes and repair means accordingly. If the found fault cause and repair means are not recorded in the fault diagnosis system previously, the new fault cause and/or repair means are/is entered and associated, so as to further improve the fault system.

Figure 4:
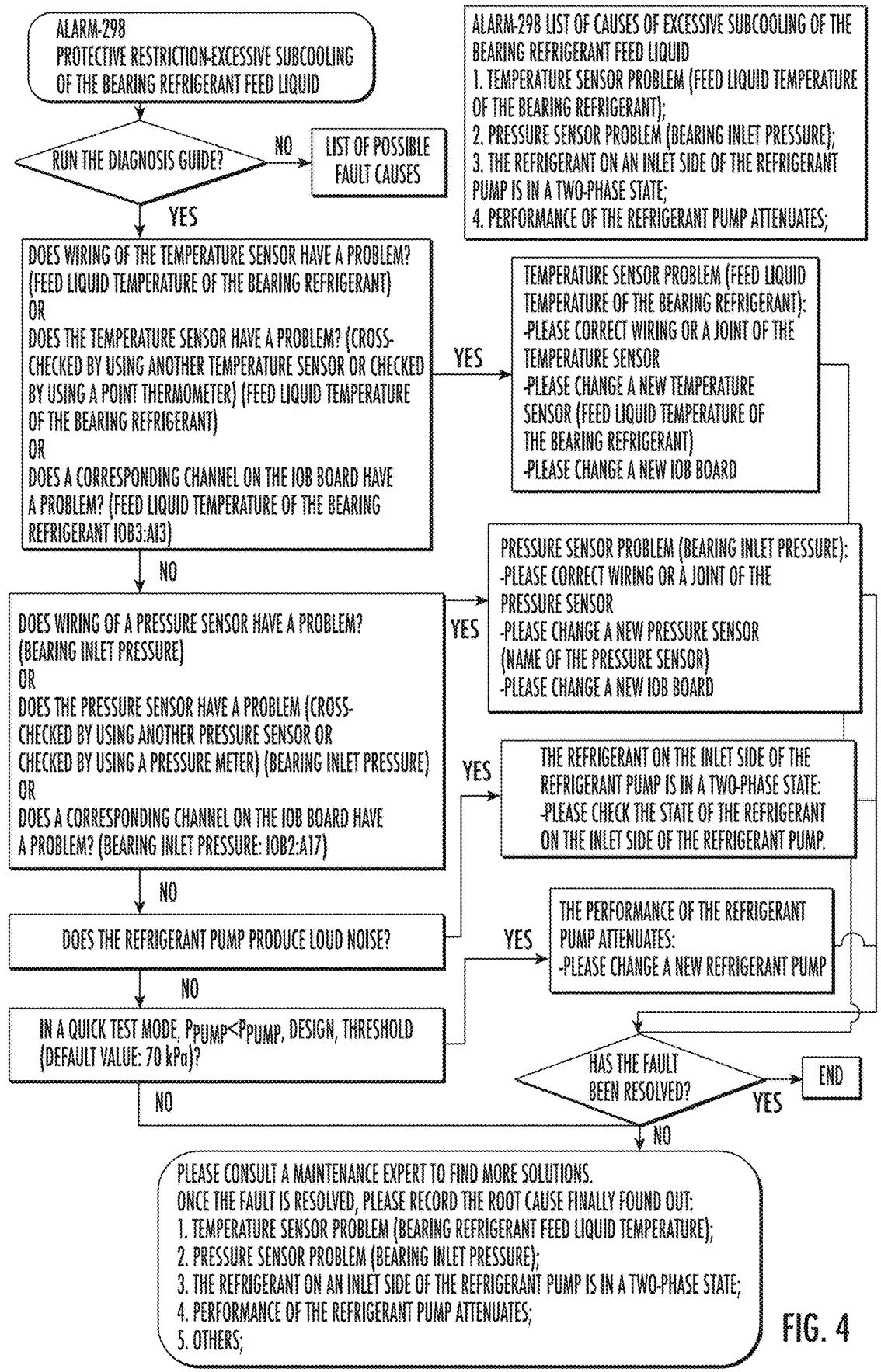
FIG. 4 is a flowchart of another embodiment of fault diagnosis by using the fault diagnosis method according to the present invention.

Referring to FIG. 4, when the refrigeration system associated with the fault diagnosis system is shut down due to a fault and sends a No. 298 fault alarm indicating "excessive subcooling of the bearing refrigerant feed liquid," the maintenance personnel can receive a corresponding alarm signal through the fault diagnosis system and determine whether to run the fault diagnosis system.

If the maintenance personnel determine that it is unnecessary to run the fault diagnosis system, the fault diagnosis system will directly output a fault cause list associated with the No. 298 fault alarm. Then, the maintenance personnel can carry out troubleshooting according to each fault cause in the fault cause list or autonomously, and repair the fault by using the repair means list corresponding to each fault cause or based on their own experience. After the foregoing process is completed, feedback indicating whether the fault is resolved is input to the fault diagnosis system. If the fault is not resolved yet, follow-up is further needed. If the fault has been resolved, the used fault cause and repair means are recorded, so as to help adjust priorities and/or recommendation levels of the fault causes and repair means accordingly. If the found fault cause and repair means are not recorded in the fault diagnosis system previously, the new fault cause and/or repair means are/is entered and associated, so as to further improve the fault system.

If the maintenance personnel determine to run the fault diagnosis system, the fault diagnosis system will check fault causes one by one based on their priorities according to the fault cause list associated with the No. 298 fault alarm. The operation convenience and/or fault possibilities are also taken into consideration in the troubleshooting priorities here, and the fault causes are as follows in order: a temperature sensor problem, a pressure sensor problem, and a refrigerant pump problem. The temperature sensor problem is further divided into a temperature sensor wiring problem, a fault in the temperature sensor itself, and a problem with a corresponding channel on an input/output circuit board. The pressure sensor problem is further divided into a pressure sensor wiring problem, a fault in the pressure sensor itself, and a problem with a corresponding channel on an input/output circuit board. The refrigerant pump problem is further divided into a refrigerant pump noise problem and a refrigerant pump performance problem.

In this case, it is first determined whether wiring of the temperature sensor of the refrigeration system for indicating a feed liquid temperature of a bearing refrigerant has a problem, whether the temperature sensor has a problem (for example, the temperature sensor can be cross-checked by using another temperature sensor or checked by using a point thermometer), or whether a corresponding channel on the input/output circuit board has a problem. If a problem is found in any of the foregoing detections, the cause of the fault may be a temperature sensor problem. After that, a corresponding repair means list can be invoked, and one of or a combination of the repair means can be selected according to the recommendation levels, so as to repair the foregoing fault quickly and reliably. Repair convenience and/or repair possibilities are also taken into consideration in the recommendation levels of the repair means here, and the repair means are as follows in order: fixing the problem by correcting wiring or a joint of the temperature sensor, or by changing a new input/output circuit board, or by changing a new temperature sensor. Moreover, in the subsequent fault cause checking process in this embodiment, repair means are all selected based on a similar recommendation level conception, and therefore details are not described again. After the foregoing process is completed, feedback indicating whether the fault has been resolved is input to the fault diagnosis system. The form and content of the feedback are similar to those described above, and therefore are not described in detail again.

If it is found after the check that the temperature sensor does not have any problem, it will be further determined whether wiring of a pressure sensor of the refrigeration system for indicating a bearing inlet pressure has a problem, whether the pressure sensor has a problem (which, for example, can be cross-checked by using another pressure sensor or checked by using a pressure meter), or whether a corresponding channel on the input/output circuit board has a problem. If a problem is found in any of the foregoing detections, the cause of the fault may be a pressure sensor problem. After that, a corresponding repair means list can be invoked to fix the problem by: correcting wiring or a joint of the pressure sensor, changing a new input/output circuit board, or changing a new pressure sensor. After the foregoing process is completed, feedback indicating whether the fault has been resolved is input to the fault diagnosis system. The form and content of the feedback are similar to those described above, and therefore are not described in detail again.

If it is found after the check that the pressure sensor does not have any problem, it will be further determined whether a refrigerant pump produces loud noise. If a problem is found in the foregoing detection, the cause of the fault may be that a refrigerant on an inlet side of the refrigerant pump is in a two-phase state. After that, a corresponding repair means list can be invoked to fix the problem by checking and adjusting the state of the refrigerant on the inlet side of the refrigerant pump. After the foregoing process is completed, feedback indicating whether the fault has been resolved is input to the fault diagnosis system. The form and content of the feedback are similar to those described above, and therefore are not described in detail again.

If it is found after the check that the refrigerant pump does not produce loud noise, it will be further determined in a quick test mode whether a pressure increment of the refrigerant pump is less than a preset pressure increment of the system. If a problem is found in the foregoing detection, the cause of the fault may be that the performance of the refrigerant pump attenuates. After that, a corresponding repair means list can be invoked to fix this problem by changing a new refrigerant pump. After the foregoing process is completed, feedback indicating whether the fault has been resolved is input to the fault diagnosis system. The form and content of the feedback are similar to those described above, and therefore are not described in detail again.

Figure 5A:
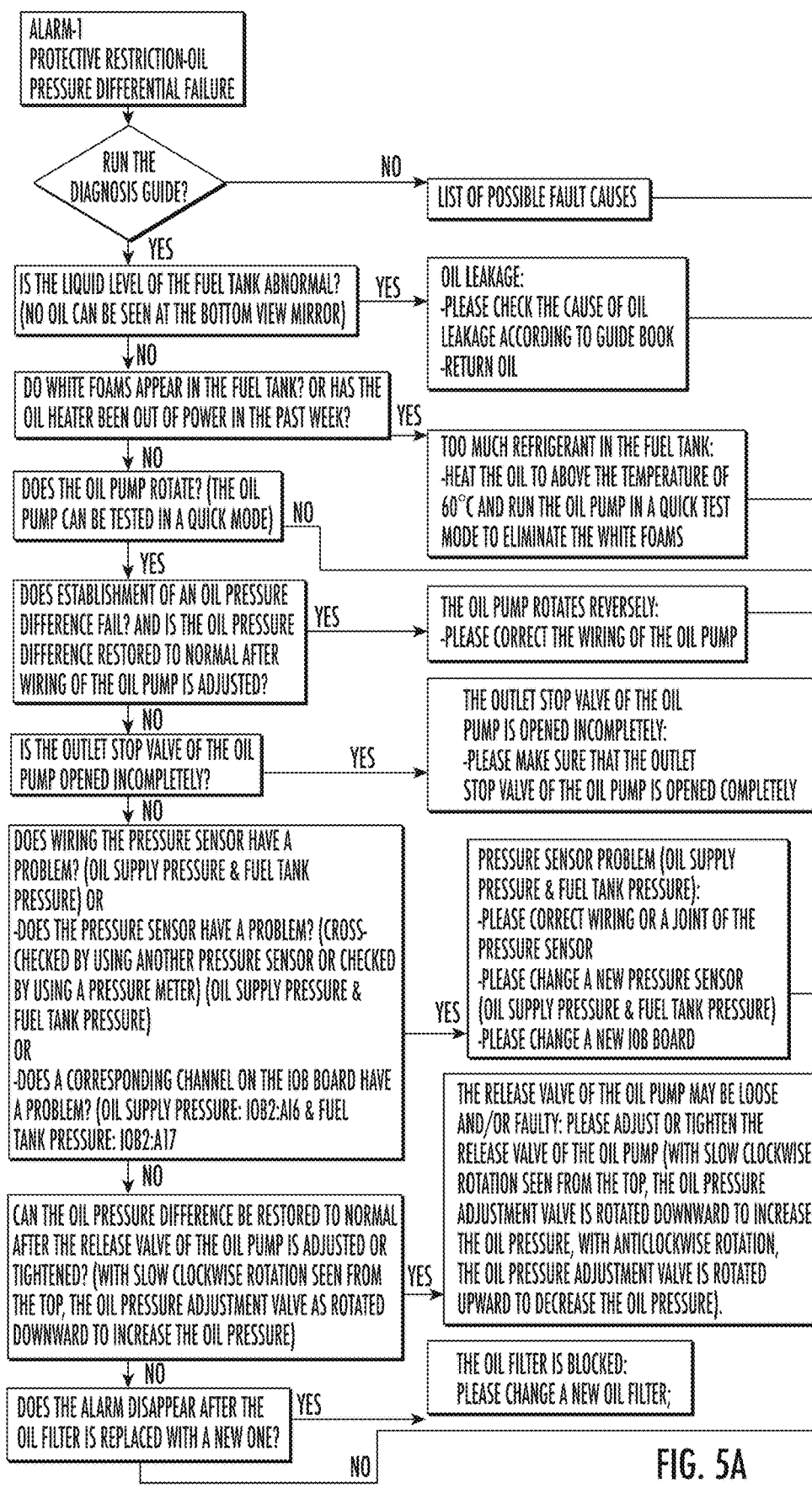
FIG. 5 is a flowchart of still another embodiment of fault diagnosis by using the fault diagnosis method according to the present invention.
Figure 5B:
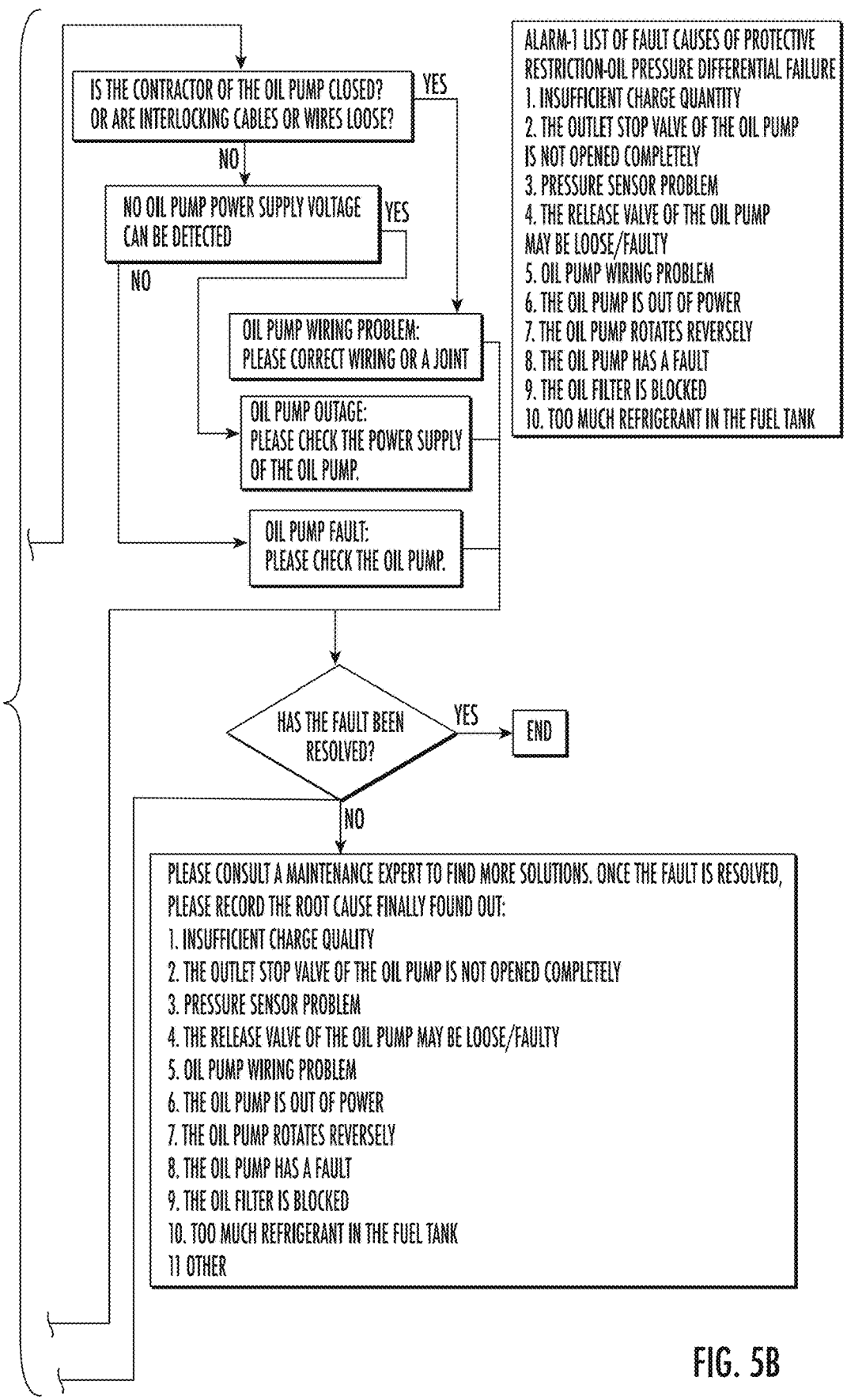

Referring to FIG. 5, when the refrigeration system associated with the fault diagnosis system is shut down due to a fault and sends a No. 1 fault alarm indicating "oil pressure differential failure," the maintenance personnel can receive a corresponding alarm signal through the fault diagnosis system and determine whether to run the fault diagnosis system.

If the maintenance personnel determine that it is unnecessary to run the fault diagnosis system, the fault diagnosis system will directly output a fault cause list associated with the No. 1 fault alarm. Then, the maintenance personnel can carry out troubleshooting according to each fault cause in the fault cause list or autonomously, and repair the fault by using the repair means list corresponding to each fault cause or based on their own experience. After the foregoing process is completed, feedback indicating whether the fault is resolved is input to the fault diagnosis system. If the fault is not resolved yet, follow-up is further needed. If the fault has been resolved, the used fault cause and repair means are recorded, so as to help adjust priorities and/or recommendation levels of the fault causes and repair means accordingly. If the found fault cause and repair means are not recorded in the fault diagnosis system previously, the new fault cause and/or repair means are/is entered and associated, so as to further improve the fault system.

If the maintenance personnel determine to run the fault diagnosis system, the fault diagnosis system will check fault causes one by one based on their priorities according to the fault cause list associated with the No. 1 fault alarm. The operation convenience and/or fault possibilities are also taken into consideration in the troubleshooting priorities here, and the fault causes are as follows in order: a fuel tank problem, an oil pump problem, an oil pump outlet stop valve problem, a pressure sensor problem, an oil pump release valve problem and an oil filter problem. The fuel tank problem is further divided into an oil leakage problem and a problem of refrigerant accumulation in the fuel tank. The oil pump problem is further divided into an oil pump wiring problem, an oil pump outage problem and a fault in the oil pump itself. The pressure sensor problem is further divided into a pressure sensor wiring problem, a fault in the pressure sensor itself and a problem with a corresponding channel on an input/output circuit board.

In this case, it is first determined whether a liquid level of the fuel tank is abnormal (for example, no oil can be seen at the bottom view mirror of the fuel tank). If a problem is found in the foregoing detection, the cause of the fault may be system oil leakage, that is, lubricating oil is taken away from the fuel tank along with the running of the refrigerant and cannot return to the fuel tank. After that, a corresponding repair means list can be invoked to fix the problem by further checking the cause of oil leakage according to guide book, or returning the oil. After the foregoing process is completed, feedback indicating whether the fault has been resolved is input to the fault diagnosis system. The form and content of the feedback are similar to those described above, and therefore are not described in detail again.

If it is found after the check that the liquid level of the fuel tank is normal, it is further determined whether white foams can be seen in the fuel tank, or whether an oil heater has been out of power in the past week. If a problem is found in any of the foregoing detections, the cause of the fault may be that an excessive amount of refrigerant is accumulated in the fuel tank. After that, a corresponding repair means list can be invoked to fix the problem by heating the oil to above the temperature of 60° C. and running the oil pump in a quick test mode to eliminate the white foams. After the foregoing process is completed, feedback indicating whether the fault has been resolved is input to the fault diagnosis system. The form and content of the feedback are similar to those described above, and therefore are not described in detail again.

If it is found after the check that there are no white foams in the fuel tank, it is further determined in the quick test mode whether the oil pump rotates. If a problem is found in the foregoing detection, a secondary diagnosis needs to be made to determine whether a contactor of the oil pump is closed, or whether interlocking cables or wires become loose. If a problem is found in the foregoing detection, the cause of the fault may be an oil pump wiring problem. After that, a corresponding repair means list can be invoked to fix the problem by correcting wiring or a joint. After the foregoing process is completed, feedback indicating whether the fault has been resolved is input to the fault diagnosis system. The form and content of the feedback are similar to those described above, and therefore are not described in detail again. If no problem is found in the foregoing secondary diagnosis, a third diagnosis needs to be made to determine whether no power supply voltage of the oil pump can be detected. If a problem is found in the foregoing detection, the cause of the fault may be oil pump outage. After that, a corresponding repair means list can be invoked to fix the problem by checking the power supply of the oil pump. After the foregoing process is completed, feedback indicating whether the fault has been resolved is input to the fault diagnosis system. The form and content of the feedback are similar to those described above, and therefore are not described in detail again. If no problem is found in the foregoing third diagnosis, the oil pump itself probably has a fault. After that, a corresponding repair means list can be invoked to fix the problem by checking the oil pump. After the foregoing process is completed, feedback indicating whether the fault has been resolved is input to the fault diagnosis system. The form and content of the feedback are similar to those described above, and therefore are not described in detail again.

If it is found after the check that the oil pump rotates normally, it is further determined whether an outlet stop valve of the oil pump is opened incompletely. If a problem is found in the foregoing detection, the cause of the fault may be a problem with an opening degree of the outlet stop valve of the oil pump. After that, a corresponding repair means list can be invoked to fix the problem by opening the outlet stop valve of the oil pump completely. After the foregoing process is completed, feedback indicating whether the fault has been resolved is input to the fault diagnosis system. The form and content of the feedback are similar to those described above, and therefore are not described in detail again.

If it is found after the check that the outlet stop valve of the oil pump has been opened completely, it is further determined whether wiring of a pressure sensor of the refrigeration system for indicating an oil supply pressure and a fuel tank pressure has a problem, whether the pressure sensor has a problem (which, for example, can be cross-checked by using another pressure sensor or checked by using a pressure meter), or whether a corresponding channel on the input/output circuit board has a problem. If a problem is found in any of the foregoing detections, the cause of the fault may be a pressure sensor problem. After that, a corresponding repair means list can be invoked, and one of or a combination of the repair means can be selected according to the recommendation levels, so as to repair the foregoing fault quickly and reliably. Repair convenience and/or repair possibilities are also taken into consideration in the recommendation levels of the repair means here, and the repair means are as follows in order: fixing the problem by correcting wiring or a joint of the pressure sensor, or by changing a new input/output circuit board, or by changing a new pressure sensor. Moreover, in the subsequent fault cause checking process in this embodiment, repair means are all selected based on a similar recommendation level conception, and therefore details are not described again. After the foregoing process is completed, feedback indicating whether the fault has been resolved is input to the fault diagnosis system. The form and content of the feedback are similar to those described above, and therefore are not described in detail again.

If it is found after the check that the pressure sensor does not have any problem, it will be further determined whether an oil pressure difference can be restored to normal after a release valve of the oil pump is adjusted or tightened (for example, in an application environment, with slow clockwise rotation seen from the top, an oil pressure adjustment valve is rotated downward to increase the oil pressure). If a problem is found in the foregoing detection, the cause of the fault may be that the release valve of the oil pump becomes loose and/or has a fault. After that, a corresponding repair means list can be invoked to fix the problem by adjusting or tightening the release valve of the oil pump (for example, in an application environment, with slow clockwise rotation seen from the top, the oil pressure adjustment valve is rotated downward to increase the oil pressure; with anticlockwise rotation, the oil pressure adjustment valve is rotated upward to decrease the oil pressure). After the foregoing process is completed, feedback indicating whether the fault has been resolved is input to the fault diagnosis system. The form and content of the feedback are similar to those described above, and therefore are not described in detail again.

If it is found after the check that the release valve of the oil pump does not have any problem, it will be further determined whether an oil pressure difference cannot be established, and whether the oil pressure difference cannot be restored to normal after the wiring of the oil pump is adjusted. If a problem is found in the foregoing detection, the cause of the problem may be reverse rotation of the oil pump. After that, a corresponding repair means list can be invoked to fix the problem by correcting the wiring of the oil pump. After the foregoing process is completed, feedback indicating whether the fault has been resolved is input to the fault diagnosis system. The form and content of the feedback are similar to those described above, and therefore are not described in detail again.

If it is found after the check that the oil pump does not have the reverse rotation problem, it will be further determined whether the alarm disappears after the oil filter is replaced with a new one. If a problem is found in the foregoing detection, the cause of the fault may be that the oil filter is blocked. After that, a corresponding repair means list can be invoked to fix the problem by changing a new oil filter. After the foregoing process is completed, feedback indicating whether the fault has been resolved is input to the fault diagnosis system. The form and content of the feedback are similar to those described above, and therefore are not described in detail again.

In an actual application, the foregoing fault diagnosis method may be carried by a storage medium that stores a corresponding program, and the fault diagnosis process can be accomplished through operations of a controller. Therefore, although not shown in the figure, a controller is further provided according to still another aspect of this conception. The controller includes a processor and a memory. The memory is configured to store instructions, and the fault diagnosis method in the foregoing embodiment is implemented when the processor executes the instructions. In addition, according to further another aspect of this conception, a storage medium is provided, which is configured to store a program, and the fault diagnosis method in the foregoing embodiment can be implemented when the program is executed.

In addition, although not shown in the figure, according to yet another aspect of this conception, a refrigeration system including a communication module is further provided to send a fault alarm to the fault diagnosis system in the foregoing embodiment, thus associating the refrigeration system with the fault diagnosis system to facilitate the subsequent fault diagnosis process.

The above examples mainly illustrate the refrigeration system, the fault diagnosis system and the fault diagnosis method for the refrigeration system, the controller and the storage medium of the present invention. Some implementation manners of the present invention are described. However, those of ordinary skill in the art should understand that the present invention can be implemented in many other forms without departing from the substance and scope thereof. Therefore, the displayed examples and implementation manners are considered as exemplary instead of limitative, and the present invention can incorporate various modifications and replacements without departing from the spirit and scope of the present invention as defined in the appended claims.

What is claimed is:

1. A fault diagnosis method for a refrigeration system, comprising:
    Step S100, receiving a fault alarm sent by an associated refrigeration system, and acquiring a fault cause list associated with the fault alarm;
    Step S200, determining whether to run a fault diagnosis system associated with the fault alarm; and
    Step S300, when the fault diagnosis system associated with the fault alarm is run, checking the associated refrigeration system sequentially according to the fault cause list, and acquiring a fault cause and a repair means list associated with the fault cause.

2. The fault diagnosis method according to claim 1, further comprising:
    Step S400, when the fault diagnosis system associated with the fault alarm is not run, directly outputting the fault cause list associated with the fault alarm.

3. The fault diagnosis method according to claim 1, further comprising:
    Step S500, inputting fault diagnosis feedback, wherein the fault diagnosis feedback comprises: the fault has been resolved or the fault is not resolved.

4. The fault diagnosis method according to claim 3, wherein the fault diagnosis feedback that the fault has been resolved comprises: the fault has been resolved based on the repair means list associated with the fault cause, or the fault has been resolved based on a new repair means for the fault cause, or the fault has been resolved based on a new fault cause and a new repair means for the new fault cause.

5. The fault diagnosis method according to claim 4, further comprising Step S600:
    when the fault has been resolved based on a new repair means for the fault cause, entering the new repair means into the repair means list and associating the new repair means with the fault cause; or
    when the fault has been resolved based on a new fault cause and a new repair means for the new fault cause, entering the new fault cause into the fault cause list, creating a repair means list associated with the new fault cause, and entering the new repair means into the repair means list.

6. The fault diagnosis method according to claim 3, wherein the fault diagnosis feedback that the fault is not resolved comprises: no fault cause is found, or no repair means is found.

7. The fault diagnosis method according to claim 1, wherein when the fault cause list comprises multiple fault causes, the multiple fault causes are sorted according to priorities based on operation convenience and/or fault possibilities, a fault cause with high operation convenience and/or a high fault possibility having a high priority; and the associated refrigeration system is checked according to the priority order of the fault causes in Step S300.

8. The fault diagnosis method according to claim 1, wherein when the repair means list comprises multiple repair means, the multiple repair means are sorted according to recommendation levels based on repair convenience and/or repair possibilities, and a repair means cause with high repair convenience and/or a high repair possibility has a high recommendation level.

9. The fault diagnosis method according to claim 1, wherein each of the fault causes is associated with one or more of the repair means.

10. The fault diagnosis method according to claim 1, wherein each of the fault causes comprises one or more judgment conditions.

11. A controller, comprising a processor and a memory, wherein the memory is configured to store instructions, and the method according to claim 1 is implemented when the processor executes the instructions.

12. A storage medium, configured to store a program, wherein the program can implement the method according to any claim 1 when being executed.

13. A fault diagnosis system for a refrigeration system, comprising:
a receiving module configured to receive a fault alarm sent by an associated refrigeration system;
a storage module configured to store fault cause lists, associations of the fault cause lists and fault alarms, repair means lists and associations of the repair means lists and fault causes; and
a processing module configured to:
acquire a fault cause list associated with the fault alarm;
determine whether to run the fault diagnosis system associated with the fault alarm; and
when the fault diagnosis system associated with the fault alarm is run, check the associated refrigeration system sequentially according to the fault cause list and acquire a fault cause and a repair means list associated with the fault cause; or when the fault diagnosis system associated with the fault alarm is not run, directly output the fault cause list associated with the fault alarm.

14. The fault diagnosis system according to claim 13, further comprising a feedback module configured to receive fault diagnosis feedback, wherein the fault diagnosis feedback comprises: the fault has been resolved or the fault is not resolved.

15. The fault diagnosis system according to claim 14, wherein the fault diagnosis feedback that the fault has been resolved comprises: the fault has been resolved based on the repair means list associated with the fault cause, or the fault has been resolved based on a new repair means for the fault cause, or the fault has been resolved based on a new fault cause and a new repair means for the new fault cause.

16. The fault diagnosis system according to claim 15, further comprising a learning module configured to: when the fault has been resolved based on a new repair means for the fault cause, enter the new repair means into the repair means list and associate the new repair means with the fault cause; or when the fault has been resolved based on a new fault cause and a new repair means for the new fault cause, enter the new fault cause into the fault cause list, create a repair means list associated with the new fault cause, and enter the new repair means into the repair means list.

17. The fault diagnosis system according to claim 14, wherein the fault diagnosis feedback that the fault is not resolved comprises: no fault cause is found, or no repair means is found.

18. The fault diagnosis system according to claim 13, further comprising a sorting module configured to: when the fault cause list comprises multiple fault causes, sort the multiple fault causes according to priorities based on operation convenience and/or fault possibilities, wherein a fault cause with high operation convenience and/or a high fault possibility has a high priority; and/or when the repair means list comprises multiple repair means, sort the multiple repair means according to recommendation levels based on repair convenience and/or repair possibilities, wherein a repair means cause with high repair convenience and/or a high repair possibility has a high recommendation level.

19. The fault diagnosis system according to claim 13, further comprising an interaction module configured to provide information interaction between on-site maintenance personnel and a control center administrator.

20. A refrigeration system, comprising: a communication module configured to send a fault alarm to the fault diagnosis system according to claim 13.

\* \* \* \* \*